United States Patent [19]
Hynecek

[11] Patent Number: 5,491,354
[45] Date of Patent: Feb. 13, 1996

[54] FLOATING GATE CHARGE DETECTION NODE

[75] Inventor: Jaroslav Hynecek, Richardson, Tex.

[73] Assignee: Texas Instruments Incorporated, Dallas, Tex.

[21] Appl. No.: 297,460

[22] Filed: Aug. 19, 1994

[51] Int. Cl.[6] .......................... H01L 29/816; G11C 19/28
[52] U.S. Cl. ......................... 257/239; 257/217; 257/224; 377/60
[58] Field of Search .................................. 257/239, 217, 257/224; 377/60

[56] References Cited

U.S. PATENT DOCUMENTS

| 4,090,095 | 5/1978 | Herrmann | 257/239 |
|---|---|---|---|
| 4,229,752 | 10/1980 | Hynecek . | |
| 4,309,624 | 1/1982 | Hynecek et al. | 257/239 |
| 4,528,684 | 7/1985 | Iida et al. | 257/239 |
| 4,668,971 | 5/1987 | Hynecek | 257/239 |
| 5,101,174 | 3/1992 | Hynecek | 257/239 |
| 5,151,380 | 9/1992 | Hynecek | 257/239 |

OTHER PUBLICATIONS

Solid State Imaging, G. F. Amelio, et al. Research and Development Laboratory, Fairchild Camera and Instrument Corporation, Palo Alto, Calif., 605–614.

Virtual Phase Technology, Jaroslave Hynecek, IEEE Transactions on Electron Devices, vol. ED–28, No. 5, May 1981, 483–489.

Primary Examiner—Gene M. Munson
Attorney, Agent, or Firm—Alan K. Stewart; Richard L. Donaldson; William E. Hiller

[57] ABSTRACT

The charge coupled device charge detection node includes a first semiconductor layer of a first conductivity type; a second semiconductor layer of a second conductivity type in the substrate; virtual gate regions of the first conductivity type formed in the second semiconductor layer, the virtual gate regions forming virtual phase potential areas; an insulating layer on the second semiconductor layer; a floating gate formed on the insulating layer, the floating gate is located above a portion of the second semiconductor layer that is between virtual gate regions, the floating gate forming a floating gate potential well in response to a voltage; a first transfer gate formed on the insulating layer and separated from the floating gate by a virtual gate region, the first transfer gate forming a transfer potential area in response to a voltage; and an electrode coupled to one of the virtual gate regions on the opposite side of the floating gate from the first transfer gate, the electrode increases the potential of the virtual phase potential area below the electrode in response to a voltage.

6 Claims, 5 Drawing Sheets

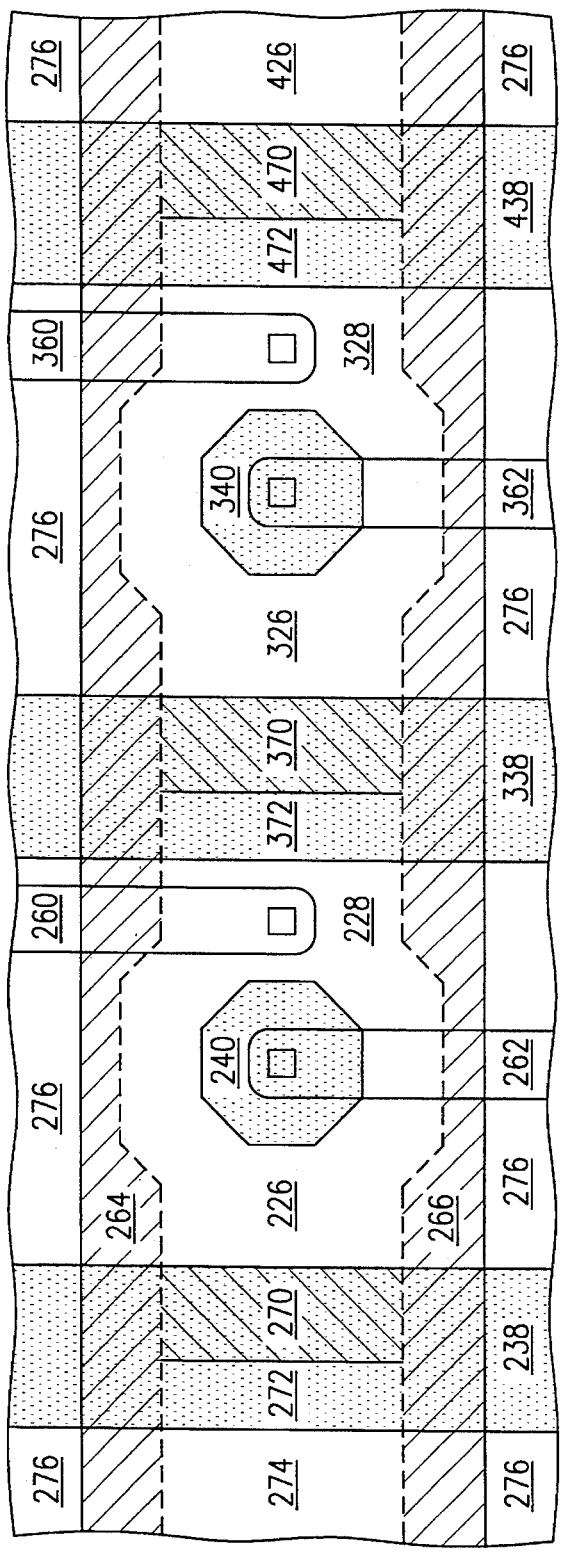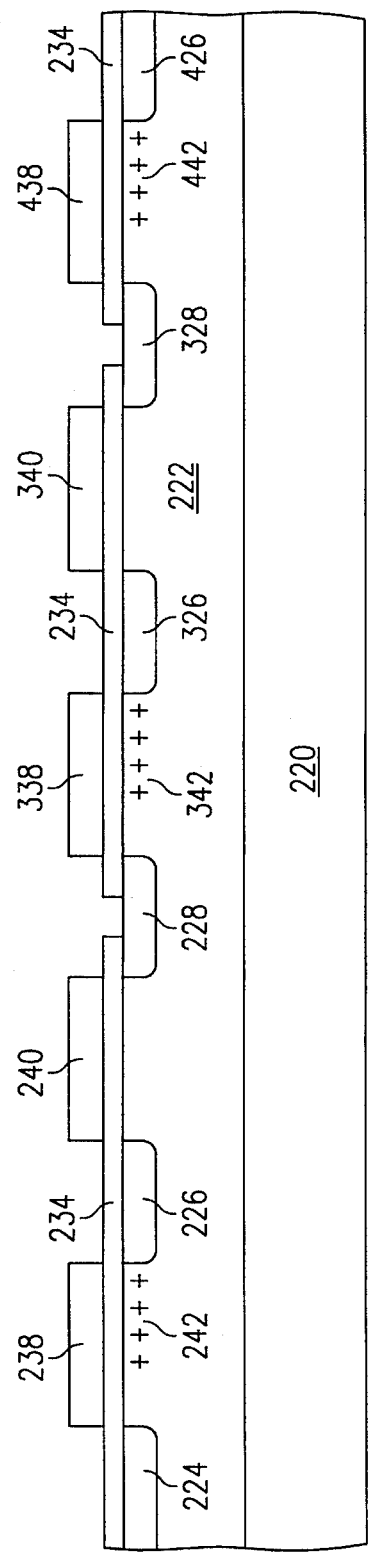

5,491,354

FLOATING GATE CHARGE DETECTION NODE

CROSS-REFERENCE TO RELATED APPLICATIONS

| Ser. No. | Filing Date | TI Case No. |
| --- | --- | --- |
| 08/297, 340 | 8/29/94 | TI-19115 |

FIELD OF THE INVENTION

This invention generally relates to image sensor devices and more particularly to charge detection nodes for charge coupled devices.

BACKGROUND OF THE INVENTION

Without limiting the scope of the invention, its background is described in connection with charge coupled device (CCD) image sensors, as an example. Essential to good low noise performance of a CCD image sensor is the charge detection node which converts charge stored at an individual photosite into a signal of adequate magnitude for further processing.

The most popular charge detection concept in CCD sensors is based on a floating diffusion circuit. A typical prior art charge detection node consists of a floating diffusion detection node. See Hynecek, J., "Method of Making Top Buss Virtual Phase Frame Interline Transfer CCD Image Sensor", U.S. Pat. No. 5,151,380, issued Sep. 29, 1992. The charge detection node is a conventional gated floating diffusion structure typically used with virtual phase CCDs and has an externally driven reset gate.

SUMMARY OF THE INVENTION

Generally, and in one form of the invention, a charge coupled device charge detection node includes a first semiconductor layer of a first conductivity type; a second semiconductor layer of a second conductivity type in the substrate; virtual gate regions of the first conductivity type formed in the second semiconductor layer, the virtual gate regions forming virtual phase potential areas; an insulating layer on the second semiconductor layer; a floating gate formed on the insulating layer, the floating gate is located above a portion of the second semiconductor layer that is between virtual gate regions, the floating gate forming a floating gate potential well in response to a voltage; a first transfer gate formed on the insulating layer and separated from the floating gate by a virtual gate region, the first transfer gate forming a transfer potential area in response to a voltage; and an electrode coupled to one of the virtual gate regions on the opposite side of the floating gate from the first transfer gate, the electrode increases the potential of the virtual phase potential area below the electrode in response to a voltage.

This invention provides several advantages. One advantage is the nondestructive charge readout. Since no charge is lost in the detection node, it can be transferred to another similar charge detection node through a CCD stage for repeated sensing.

BRIEF DESCRIPTION OF THE DRAWINGS

In the drawings:

FIG. 9 is a plan view of a second preferred embodiment floating gate charge detection node;

FIG. 10 is a cross-section of the second preferred embodiment floating gate charge detection node through the line A—A' shown in FIG. 9.

Corresponding numerals and symbols in the different figures refer to corresponding parts unless otherwise indicated.

DETAILED DESCRIPTION OF PREFERRED EMBODIMENTS

Figure 1:
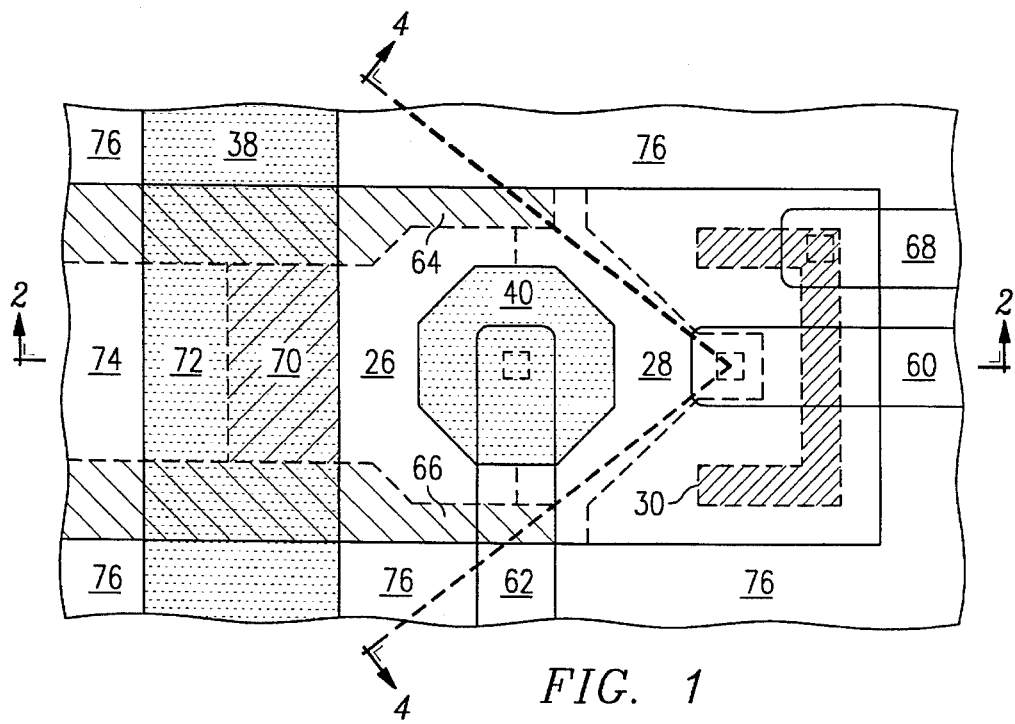
FIG. 1 is a plan view of a first preferred embodiment floating gate charge detection node.

FIG. 1 is a plan view of a first preferred embodiment floating gate charge detection node. The structure of FIG. 1 includes transfer gate 38, floating gate 40, reset metal lead 60, floating gate metal lead 62, channel stop regions 64 and 66, virtual barrier region 26, virtual well region 28, N+ drain region 30, drain metal lead 68, clocked well region 70, clocked barrier region 72, virtual well region 74, and thick field oxide 76.

Figure 2:
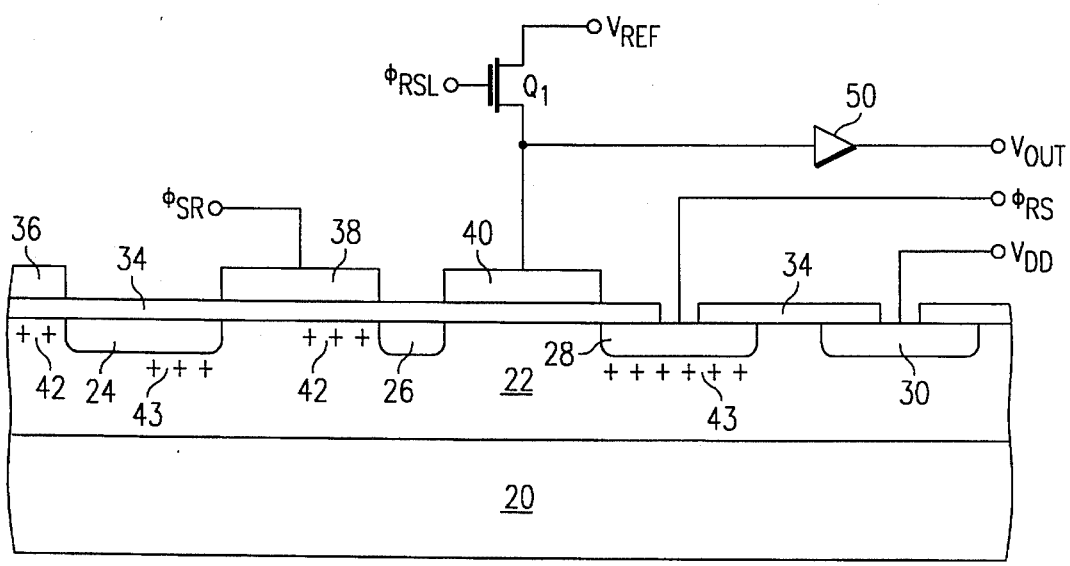
FIG. 2 is a cross-section of a first preferred embodiment floating gate charge detection node through the line A—A' shown in FIG. 1.
Figure 3:
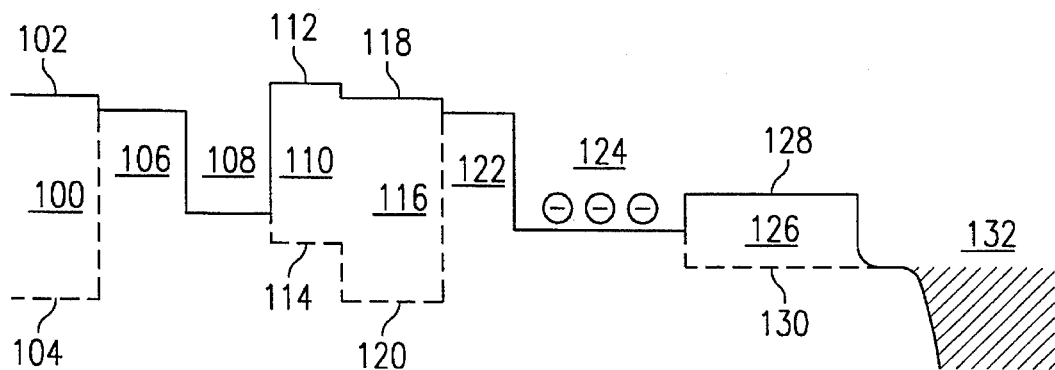
FIG. 3 is a diagram of the potential wells created by the device of FIG. 1.

FIG. 2 is a cross-sectional view of FIG. 1 taken along the axis A—A'. FIG. 3 is a corresponding potential diagram of the same cross-section. The structure of FIG. 2 includes P type silicon substrate 20, N type layer 22 in the substrate 20, P+ virtual gate regions 24, 26, and 28 formed in the upper portion of N type layer 22, gate insulator layer 34, transfer gates 36 and 38, floating gate 40, donor implants 42 in the N type layer 22, donor implants 43 below virtual phase regions 24 and 28, N+ drain 30, transistor $Q_1$, amplifier 50, serial register clocked voltage $\phi_{SR}$, reference voltage $V_{REF}$, reset clocked voltage $\phi_{RS}$, refresh clocked voltage $\phi_{RSL}$, output voltage $V_{OUT}$, and drain voltage $V_{DD}$. Reset metal lead 60 and floating gate metal lead 62, shown in FIG. 1, are not shown in FIG. 2. Transfer gate 36, shown in FIG. 2, is not shown in FIG. 1. $\phi_{SR}$ is the serial register clock signal which controls the CCD shift register. $\phi_{RS}$ is the reset clock signal which controls the virtual gate 28. $V_{out}$ is the output signal from the amplifier 50. $V_{REF}$ is the bias signal for the floating gate 40. $V_{DD}$ is the drain voltage. $\phi_{RSL}$ is the gate input signal for the transistor $Q_1$. Drain 30 can be replaced with another transfer gate, as shown in FIG. 9. Donor implants 43 below virtual gate region 28 can be left out of the circuit if a lower voltage is used for $V_{REF}$, as described below for the device of FIG. 10.

The potential diagram of FIG. 3 includes clocked well 100 with potential levels 102 and 104, virtual barrier 106, virtual well 108, clocked barrier 110 with potential levels 112 and 114, clocked well 116 with potential levels 118 and 120, virtual barrier 122, floating gate well 124, virtual well 126 with potential levels 128 and 130, and charge drain region 132.

Figure 4:
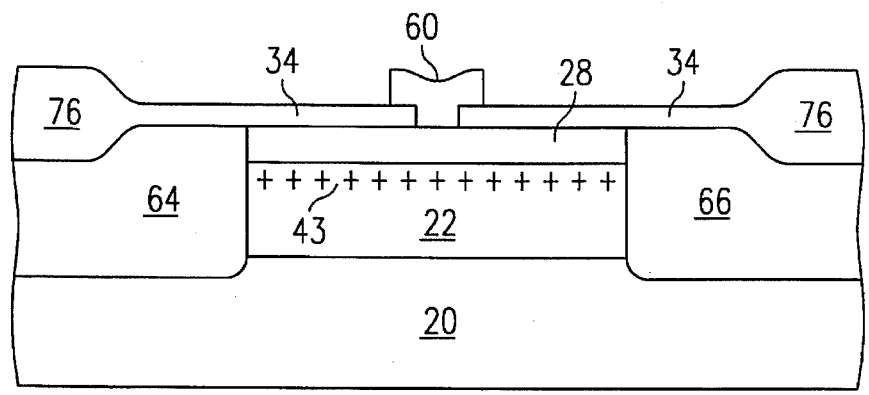
FIG. 4 is a cross-section of the first preferred embodiment floating gate charge detection node through the line B—B' shown in FIG. 1.
Figure 5:
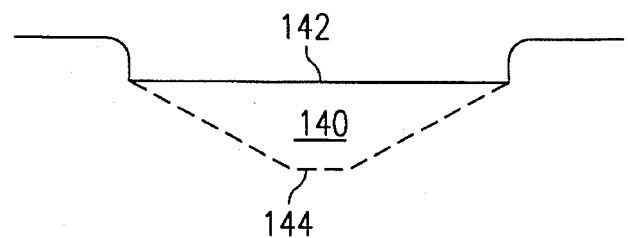
FIG. 5 is a diagram of the potential wells created by the device of FIG. 4.

FIG. 4 is a cross-sectional view of FIG. 1 taken along the line B—B'. FIG. 5 is a corresponding potential diagram of the same cross-section. The structure of FIG. 4 includes P type silicon substrate 20, N type layer 22 in the substrate 20, P+ virtual phase region 28 formed in the upper portion of N type layer 22, gate insulator layer 34, donor implants 43 below virtual phase region 28, channel stop regions 64 and 66, thick field oxide 76, and reset metal lead 60.

The potential diagram of FIG. 5 shows virtual well 140 at potential levels 142 and 144. Potential level 142 corresponds with potential level 128 in FIG. 3. Potential level 144 corresponds with potential level 130 in FIG. 3. Potential level 142 is the potential level when $\phi_{RS}$ is off. Potential level 144 is the potential level when $\phi_{RS}$ is on.

Figure 6:
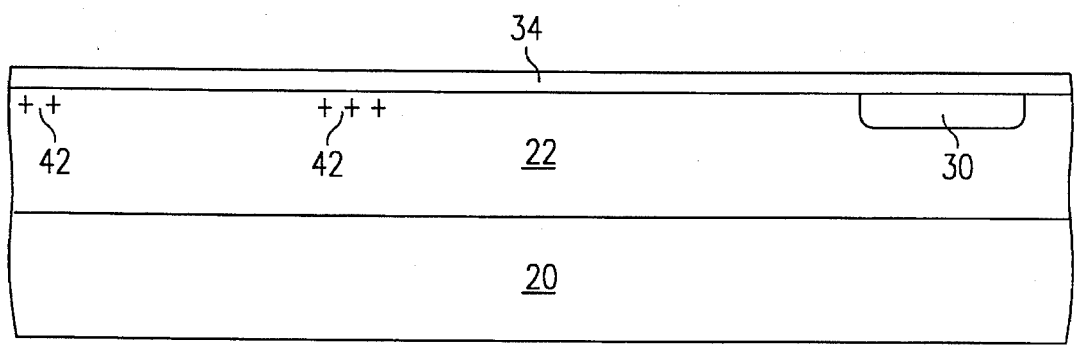
FIGS. 6–8 show the device of FIG. 2 at three stages of fabrication.
Figure 7:
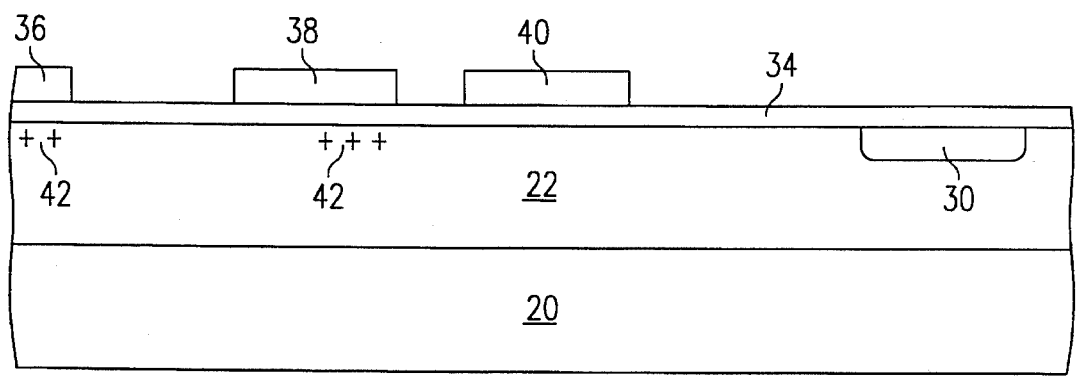
Figure 8:
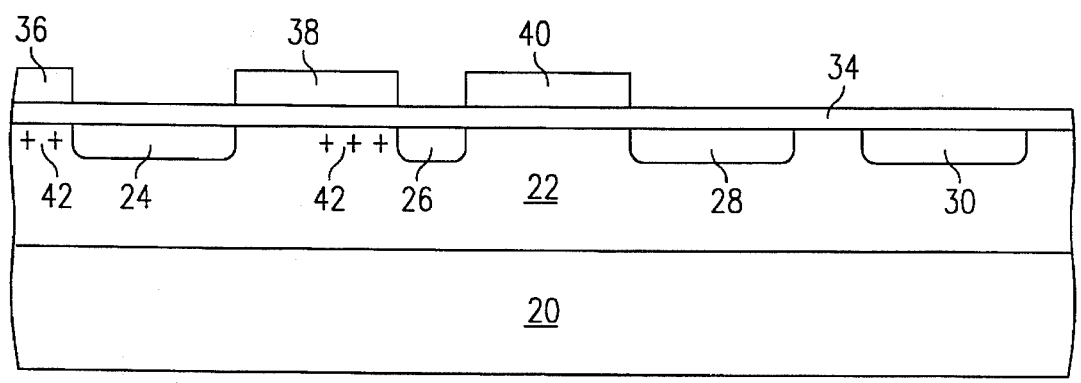

FIGS. 6–8 illustrate successive steps in a process for fabricating a floating gate detection node according to the preferred embodiment, as shown in FIG. 2. First the channel stop regions 64 and 66 are formed in P type substrate 20. Then thick field oxide 76 is formed over portions of the channel stop regions 64 and 66, as shown in FIG. 4. Referring to FIG. 6, an N type layer 22 is then formed in P type semiconductor substrate 20 between the channel stop regions 64 and 66. N type layer 22 may be formed by ion implantation. A dopant such as phosphorus may be used as the implant dopant. Then a gate insulator layer 34 is formed over the surface of the device. The gate insulator layer 34 is preferably formed of oxide and may be grown from the substrate. Next, a photoresist layer is used to pattern an implant into N type layer 22 to form donor implants 42 shown in FIG. 6. This implant is done with an N type dopant such as arsenic or phosphorous. After the photoresist layer is stripped, another photoresist layer is used to pattern an implant into N type layer 22 to form N+ drain 30, shown in FIG. 6. This implant is also done with an N type dopant such as phosphorous or arsenic. For additional charge detection nodes, the drain 30 is replaced by another transfer gate, as shown in FIG. 9.

After the photoresist layer is stripped, the floating gate 40 and the transfer gates 36 and 38 are deposited, doped to be conductive, patterned, and etched, as shown in FIG. 7. The floating gate 40 and the transfer gates 36 and 38 can be polysilicon, in which case they may be doped in place by a dopant such as phosphoric oxytrichloride ($POCl_3$). Next, the floating gate 40 and the transfer gates 36 and 38 are used for a self-aligned implantation step to form P+ virtual phase regions 24, 26, and 28, as shown in FIG. 8. This implant is done with a P type dopant such as boron. Then a photoresist layer may be used to pattern an implant to form donor implants 43 shown in FIG. 2. The donor implants 43 are self aligned to the transfer gates 36 and 38 and the floating gate 40. This implant is done with an N type dopant such as phosphorous.

In standard virtual phase CCD it is difficult to implement a floating gate detection node due to the necessity for a negative bias on the floating gate and no capability for reset. The resistive gate approach of the preferred embodiment eliminates the need for a negative bias on the floating gate and provides the capability for reset.

A bias voltage $V_{REF}$ of several volts generates a potential well 124, shown in FIG. 3, under the floating gate 40 for collection of charge underneath. The floating gate 40 is coupled to amplifier 50 and reset transistor $Q_1$. The floating gate potential well 124 is restored after each line of image data by pulsing $Q_1$ on. As charge is transferred into well 124, the voltage on the floating gate 40 changes and is sensed by the amplifier 50. After the sensing is completed, signal charge is transferred out of the floating gate well 124 by pulsing the virtual gate 28 positive. Since virtual gate 28 is connected resistively to substrate 20 through channel stop regions 64 and 66, a current will flow laterally through this gate. When the potential is high enough, the potential well 126, shown in FIG. 3, under virtual gate 28 will increase to the point that a complete reset will occur. (A complete reset is when all charge is cleared from the floating gate potential well 124.) During reset, charge is transferred out of the floating gate well 124, through the virtual well 126, and into charge drain region 132, or in the case of continuing CCD structures, into the clocked barrier and clocked well of the next CCD stage.

The operation of the device of FIG. 1 is explained in more detail by referring to the potential profile shown in FIG. 3. The energy levels for an electron in the buried channel (conduction band minimum) are shown for the various regions of the device and for different bias levels of the transfer gates 36 and 38, and different bias levels of the virtual gate 28 (resistive gate). Starting with an electron in the clocked barrier 110 at level 114 below transfer gate 38 with the transfer gate bias approximately equal to substrate bias, the operation is as follows. First the electron moves into the clocked well 116 at level 120. The electron will remain in the clocked well 116 as long as the transfer gate bias is approximately equal to substrate bias because the potential wells of both adjacent regions are at a lower potential. When the transfer gate 38 is switched to a negative bias with respect to the substrate 20, the potential level of the clocked well 116 changes to level 118 and the potential level of clocked barrier 110 changes to level 112. As a result, the electron passes from the clocked well 116 to the virtual barrier 122. The electron then moves from the virtual barrier 122 into the floating gate well 124 where the presence of charge is detected through sensing the potential of the floating gate 40.

For reset, virtual gate 28 is biased positive by clocked voltage $\phi_{RS}$ which changes the potential level of virtual well 126 from level 128 to level 130. As a result, the electron passes from the floating gate well 124 to the virtual well 126. The electron then moves into the charge drain region 132 where it is removed. The electron can also continue into another gate similar to gate 38 for additional sensing. Charge removal from the well 124 is called reset. This reset process provides a complete reset because there is no charge remaining in the floating gate well 124 after charge is transferred to the charge drain region 132 or to the next CCD stage.

The transfer gates 36 and 38, shown in FIG. 2, make up a portion of a CCD shift register. The remaining portion of the CCD shift register is not shown. The CCD shift register transfers charge to the charge detection node. The structure of the transfer gates is shown by the transfer gates 36 and 38, shown in FIG. 2. Charge is transferred through the shift register to the charge detection node by clocking the voltages on the transfer gates. Once charge is transferred into the floating gate well 124, charge is detected by sensing the voltage at the floating gate 40.

The timing cycle starts with a reset period to clear charge from the floating gate well 124. For the reset period, the reset signal $\phi_{RS}$ is switched on. The reset signal $\phi_{RS}$ causes a current to flow through the virtual gate 28 to the channel stop regions 64 and 66 and on to the substrate 20. The amount of current is determined by the resistivity of the virtual gate and the signal $\phi_{RS}$. $\phi_{RS}$ increases the potential of the virtual well 126 to level 130, shown in FIG. 3. This forces charge to move from the floating gate well 124 to the charge drain region 132.

After the reset period, the reset signal $\phi_{RS}$ returns to a lower voltage. Then the floating gate well 124 is ready to receive charge from the shift register. The serial register clock signal $\phi_{SR}$ is then switched to a low voltage which changes the potential of transfer gate well 116 from level 120 to level 118. This causes charge in the last transfer gate well 116, shown in FIG. 3, to move into the floating gate well 124. When charge moves into the floating gate well 124, the potential level of the floating gate well 124 changes. The potential level of the floating gate well 124 is dependent on the amount of charge that is transferred from the last transfer well of the serial register. This change in potential level is sensed on the floating gate 40.

Another transfer gate can be added to the circuit of FIG. 1 in place of the charge clearing drain 28 to facilitate multiple detection of the same charge. A second preferred embodiment, shown in FIG. 9, includes two floating gate detection nodes connected in series. FIG. 9 is a plan view of the second preferred embodiment floating gate charge detection node. The structure of FIG. 9 includes transfer gates 238, 338, and 438, floating gates 240 and 340, reset metal leads 260 and 360, floating gate metal leads 262 and 362, channel stop regions 264 and 266, virtual gate regions 274, 226, 228, 326,328, and 426, clocked well regions 270, 370, and 470, clocked barrier regions 272, 372, and 472, and thick field oxide 276. Virtual gate regions 226 and 228 form a virtual gate that surrounds the region below floating gate 240, as shown in FIG. 9. Virtual gate regions 326 and 328 form a virtual gate that surrounds the region below floating gate 340, as shown in FIG. 9.

Figure 11:
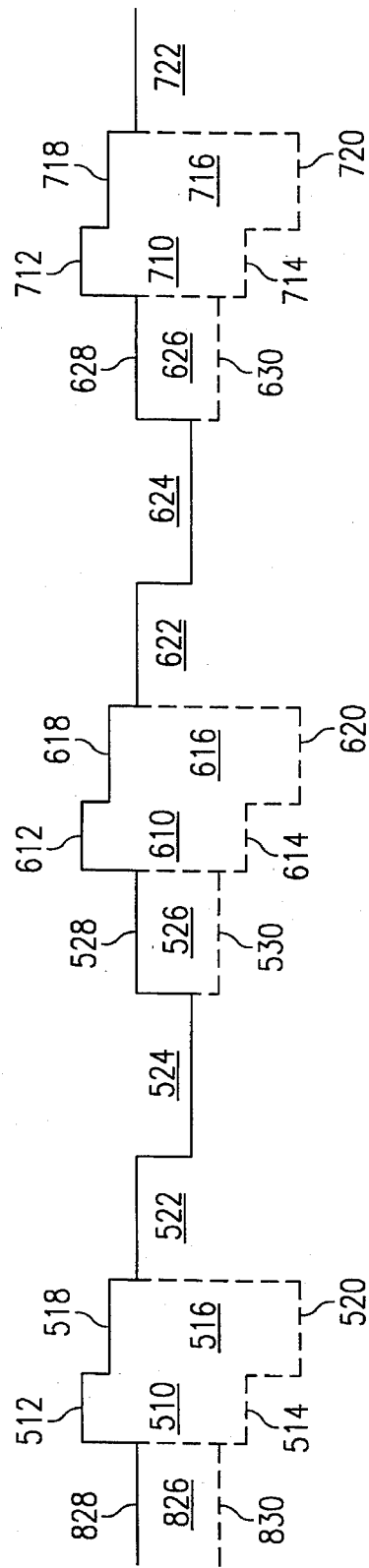
FIG. 11 is a diagram of the potential wells created by the device of FIG. 10.

FIG. 10 is a cross-sectional view of FIG. 9 taken along the axis A—A'. FIG. 11 is a corresponding potential diagram of the same cross-section. The structure of FIG. 10 includes P type silicon substrate 220, N type layer 222 in the substrate 220, P+ virtual gate regions 224, 226, 228, 326, 328, and 426 formed in the upper portion of N type layer 222, gate insulator layer 234, transfer gates 238, 338, and 438, floating gates 240 and 340, and donor implants 242, 342, and 442 in N type layer 222. Reset metal leads 260 and 360 and floating gate metal leads 262 and 362, shown in FIG. 9, are not shown in FIG. 10.

The potential diagram of FIG. 11 includes virtual barrier 826 with potential levels 828 and 830, clocked barrier 510 with potential levels 512 and 514, clocked well 516 with potential levels 518 and 520, virtual barrier 522, floating gate well 524, virtual barrier 526 with potential levels 528 and 530, clocked barrier 610 with potential levels 612 and 614, clocked well 616 with potential levels 618 and 620, virtual barrier 622, floating gate well 624, virtual barrier 626 with potential levels 628 and 630, clocked barrier 710 with potential levels 712 and 714, clocked well 716 with potential levels 718 and 720, and virtual barrier 722.

Each detection node in FIG. 9 is similar to the detection node in FIG. 1 except the charge drain 30 of FIG. 1 has been replaced by transfer gates 338 and 438. Also, the virtual well 126 of FIG. 3 has been replaced by virtual barriers 526 and 626, which allows the reference voltage $V_{REF2}$ to be smaller than the reference voltage $V_{REF}$ of FIG. 2. The reset metal leads 260 and 360 are connected to virtual gates 228 and 328, respectively.

The operation of the device of FIG. 10 is similar to that of FIG. 2 and is explained by referring to the potential profile shown in FIG. 11. The energy levels for an electron in the buried channel (conduction band minimum) are shown for the various regions of the device and for different bias levels of the transfer gates 238, 338, and 438, and different bias levels of the virtual gates 228, 328, and 274 (resistive gates). Starting with an electron in the clocked barrier 510 at level 514 below transfer gate 238 with the transfer gate bias approximately equal to substrate bias, the operation is as follows. First the electron moves into clocked well 516 at level 520. The electron will remain in clocked well 516 as long as the transfer gate bias is approximately equal to substrate bias because the potential wells of both adjacent regions are at a lower potential. When transfer gate 238 is switched to a negative bias with respect to the substrate 220, the potential level of clocked well 516 changes to level 518 and the potential level of clocked barrier 510 changes to level 512. As a result, the electron passes from clocked well 516 to virtual barrier 522. The electron then moves from virtual barrier 522 into floating gate well 524 where the presence of charge is detected through sensing the potential of floating gate 240.

Then virtual gate 228 is biased positive which changes the potential level of virtual well 526 from level 528 to level 530. As a result, the electron passes from floating gate well 524 to resistive gate well 526. The electron then continues into clocked barrier 610 and on into clocked well 616. Charge transfer from clocked well 616 to clocked well 716 is the same process as described above for transfer from clocked well 516 to clocked well 616.

In FIG. 2 transistor $Q_1$ is used to refresh the potential on the floating gate 40. For high performance operation transistor $Q_1$ needs to be very small so that the additional capacitance of this structure does not significantly increase the overall floating gate node capacitance and thus reduce the charge detection sensitivity.

Figure 12:
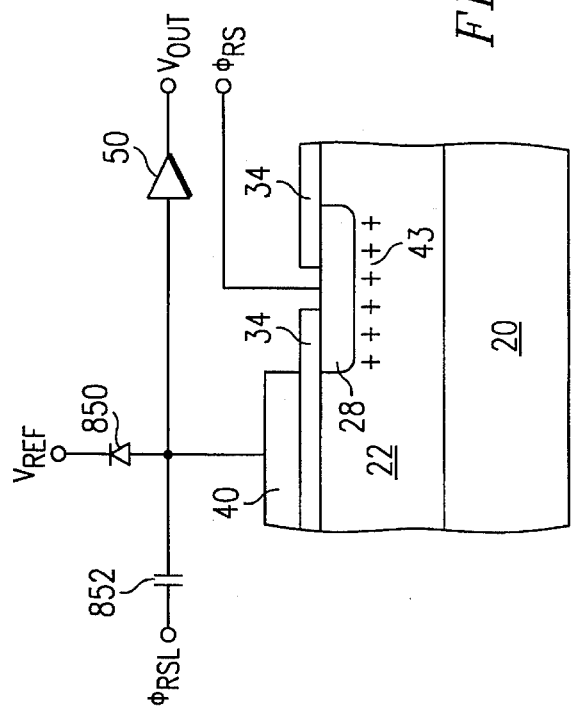
FIG. 12 is an alternative embodiment for restoring the potential on the floating gate shown in FIG. 2.

An alternative embodiment for restoring the potential on the floating gate 40 is shown in FIG. 12. Transistor $Q_1$ of FIG. 2 is replaced by a small P–N diode 850 in the circuit of FIG. 12. The feed through coupling from the virtual phase reset gate 28 causes the diode 850 to conduct and charge the floating gate 40 to a new reference level. This level is determined by the $V_{REF}$ bias and by the magnitude of the reset feed through. Since all the subsequent charge sensing produces potential changes which are in a negative direction (electron sensing) the diode 850 will remain reverse biased until the next reset pulse from $\phi_{RS}$. The reset pulse at the end of the line which momentarily forward biases the diode 850 only replenishes charge which escaped from the node due to the diode leakage current. The advantages of the diode 850 include small size, small parasitic capacitance, simplicity of operation, and low noise. Optionally, the refresh pulse $\phi_{RSL}$ can be coupled to the floating gate 40 through a capacitor 852. Other reset structures such as JFETs, dual gate MOS transistors, and bipolar transistors can also be used in place of $Q_1$ in FIG. 2.

This invention provides the advantage of a nondestructive charge detection node. Charge can be sensed multiple times by placing several of the nondestructive charge detection nodes in series. This provides a technique for charge amplification which is important for high resolution image sensing where the pixel area is small and, therefore, the amount of charge generated in each pixel by incident light is small. Also, because of the complete charge clearing reset process of the floating gate detection node, the device has no kTC noise. This leads to lower noise performance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A charge coupled device charge detection node comprising:

a first semiconductor layer of a first conductivity type;

a second semiconductor layer of a second conductivity type in the substrate;

virtual gate regions of the first conductivity type formed in the second semiconductor layer, the virtual gate regions forming virtual phase potential areas;

an insulating layer on the second semiconductor layer;

a floating gate formed on the insulating layer, the floating gate is located above a portion of the second semiconductor layer that is between virtual gate regions, the floating gate forming a floating gate potential well in response to a voltage;

a first transfer gate formed on the insulating layer and separated from the floating gate by a virtual gate region, the first transfer gate forming a transfer potential area in response to a voltage; and an electrode coupled to one of the virtual gate regions on the opposite side of the floating gate from the first transfer gate, the electrode increases the potential of the virtual phase potential area below the electrode in response to a voltage.

2. The device of claim 1 further comprising donor impurities in the second semiconductor layer below portions of the first transfer gate.

3. The device of claim 1 wherein charge is transferred from the floating gate potential well by increasing the voltage on the electrode.

4. The device of claim 1 further comprising a charge drain region of a second conductivity type formed in the second semiconductor layer and spaced apart from the virtual gate regions, the floating gate located between the first transfer gate and the charge drain region.

5. The device of claim 1 further comprising a second transfer gate formed on the insulating layer and adjacent one of the virtual gate regions, the floating gate located between the first transfer gate and the second transfer gate, the second transfer gate forming a transfer potential area in response to a voltage.

6. A charge coupled device charge detection device comprising:

a semiconductor layer of a first conductivity type;

a transfer gate above the semiconductor layer;

a clocked barrier region in the semiconductor layer beneath the transfer gate;

a clocked well region in the semiconductor layer beneath the transfer gate and adjoining the clocked barrier region;

a first virtual gate of a second conductivity type in the semiconductor layer and adjacent the transfer gate;

a first virtual potential region in the semiconductor layer below the first virtual gate and adjoining the clocked well region;

a floating gate above the semiconductor layer and separated from the transfer gate by the first virtual gate;

a floating gate well region in the semiconductor layer beneath the floating gate and adjoining the first virtual potential region;

a second virtual gate of the second conductivity type in the semiconductor layer and adjacent the floating gate;

a second virtual potential region in the semiconductor layer below the second virtual gate and adjoining the floating gate well region, the floating gate well region located between the second virtual potential region and the first virtual potential region, the second virtual potential region having a variable potential level, whereby charge is stored in the clocked well region while a first high bias is applied to the transfer gate, the charge is transferred into the floating gate well region from the clocked well region when a low bias is applied to the transfer gate electrode, the charge level in the floating gate well region is detected by the floating gate, and the charge is transferred out of the floating gate well region when the second virtual potential region has a higher potential level than the floating gate well region.

* * * * *